(12) United States Patent
Lee et al.

(10) Patent No.: US 7,807,009 B2
(45) Date of Patent: Oct. 5, 2010

(54) HERMETIC SEALING APPARATUS AND HERMETIC SEALING METHOD USING FRIT

(75) Inventors: Jung-Min Lee, Suwon-si (KR);
Choong-Ho Lee, Suwon-si (KR);
Seok-Joon Yoon, Suwon-si (KR);
Won-Kyu Choe, Suwon-si (KR);
Tae-Wook Kang, Suwon-si (KR)

(73) Assignee: Samsung Mobile Display Co., Ltd., Gyeonggi-do (KR)

( * ) Notice: Subject to any disclaimer, the term of this patent is extended or adjusted under 35 U.S.C. 154(b) by 206 days.

(21) Appl. No.: 12/228,994

(22) Filed: Aug. 18, 2008

(65) Prior Publication Data

US 2009/0229745 A1 Sep. 17, 2009

(30) Foreign Application Priority Data

Mar. 17, 2008 (KR) ...................... 10-2008-0024345

(51) Int. Cl.
*B32B 37/06* (2006.01)

(52) U.S. Cl. .................... 156/283; 156/99; 156/272.8; 156/380.9; 156/581; 264/272.11; 264/272.14; 264/272.17

(58) Field of Classification Search .................. 156/99, 156/272.2, 272.8, 283, 379.6, 380.9, 499, 156/580.2, 581, 582; 264/272.1, 272.11, 264/272.14, 272.17
See application file for complete search history.

(56) References Cited

U.S. PATENT DOCUMENTS

| | | | | |
|---|---|---|---|---|
| 3,392,312 A | * | 7/1968 | Carman | ...................... 257/794 |
| 4,833,039 A | * | 5/1989 | Mitoff et al. | ................. 428/552 |
| 5,641,713 A | * | 6/1997 | Kyle | ........................... 156/330 |
| 6,661,084 B1 | * | 12/2003 | Peterson et al. | ............. 257/680 |
| 2004/0207314 A1 | * | 10/2004 | Aitken et al. | ................. 313/504 |
| 2005/0001545 A1 | * | 1/2005 | Aitken et al. | ................. 313/512 |
| 2005/0248270 A1 | * | 11/2005 | Ghosh et al. | ................. 313/512 |
| 2006/0009109 A1 | * | 1/2006 | Aitken et al. | ................... 445/24 |
| 2006/0082298 A1 | * | 4/2006 | Becken et al. | ............... 313/512 |
| 2007/0128966 A1 | * | 6/2007 | Becken et al. | ................. 445/25 |
| 2007/0188757 A1 | * | 8/2007 | Amsden et al. | ............. 356/401 |

FOREIGN PATENT DOCUMENTS

| | | | |
|---|---|---|---|
| JP | 2002373581 A | * | 12/2002 |
| JP | 2003-123966 | | 4/2003 |
| KR | 10-2002-0096927 | | 12/2002 |

OTHER PUBLICATIONS

English machine translation of JP 2002-373581, retrieved from JPO database May 11, 2010.*
Office Action in Korean Patent Application No. 2008-0024345, mailed Oct. 28, 2009.

* cited by examiner

*Primary Examiner*—Joseph S Del Sole
*Assistant Examiner*—Timothy Kennedy
(74) *Attorney, Agent, or Firm*—Knobbe Martens Olson & Bear LLP

(57) ABSTRACT

An hermetic sealing apparatus is discussed. The apparatus may include one or more of the following a glass mask disposed on an upper surface of a first substrate, a support member disposed on an upper surface of the glass mask, a laser irradiation member positioned spaced on the upper surface of the glass mask, a plurality of lower support members disposed in a contour region of a lower surface of the second substrate, and pressing members disposed on a lower surface of the lower support members.

23 Claims, 8 Drawing Sheets

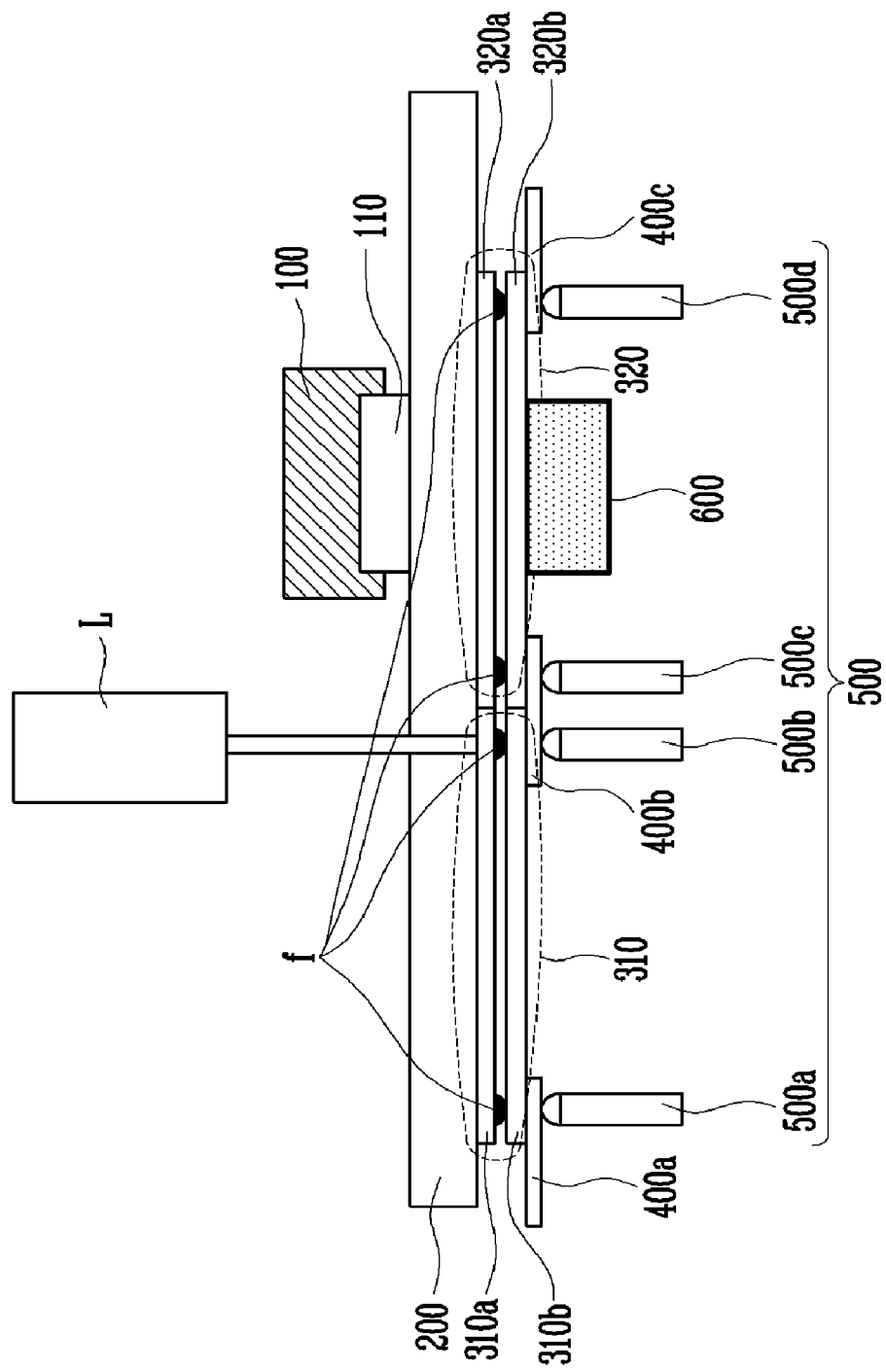

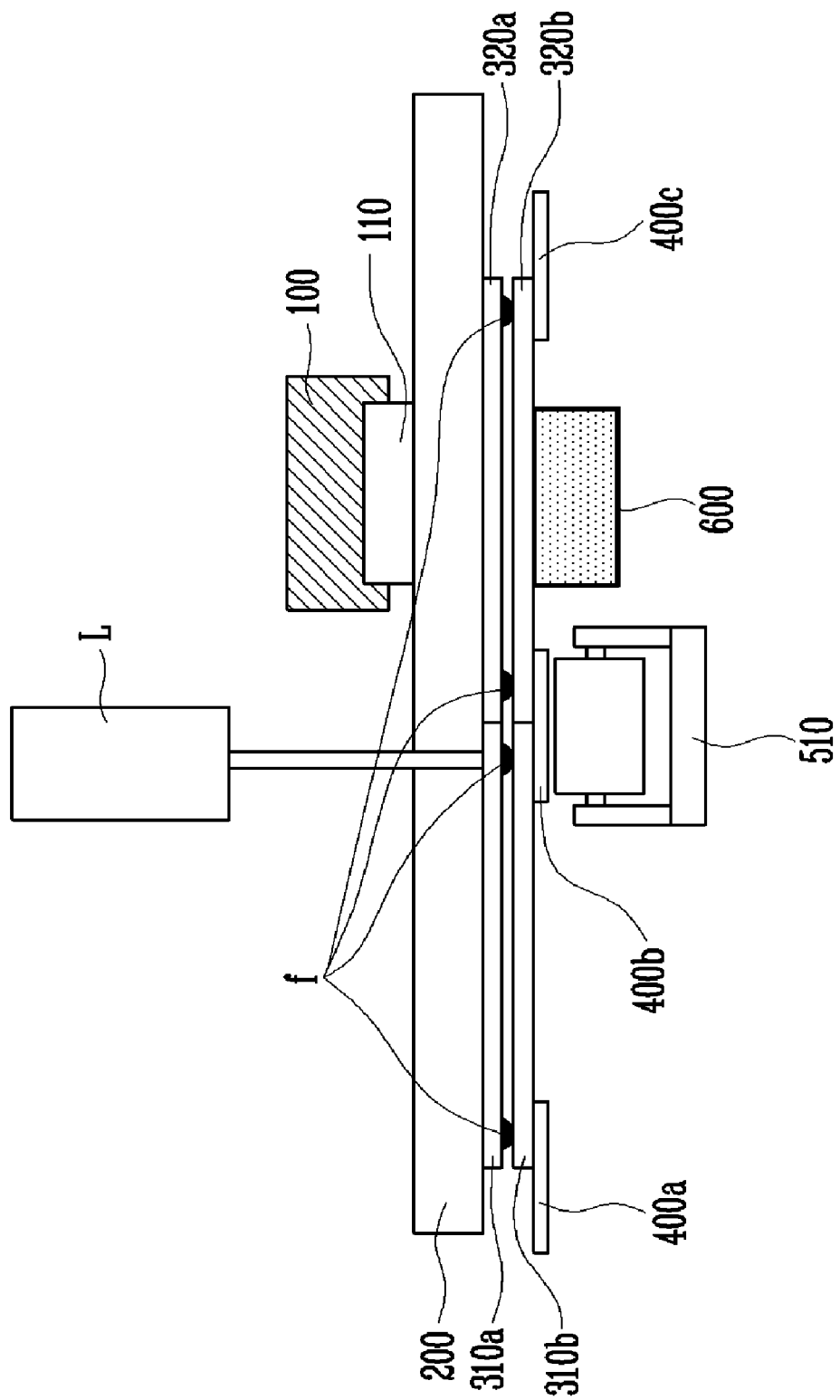

HERMETIC SEALING APPARATUS AND HERMETIC SEALING METHOD USING FRIT

CROSS-REFERENCE TO RELATED APPLICATIONS

This application claims the benefit of Korean Patent Application No. 10-2008-0024345, filed on Mar. 17, 2008, in the Korean Intellectual Property Office, which is hereby incorporated by reference in its entirety.

BACKGROUND OF THE INVENTION

1. Field of the Invention

The present invention relates to a hermetically sealed apparatus and a method of hermetically sealing a thin film device.

2. Description of the Related Technology

A thin film device may include an organic light emitting display (OLED), a sensor, an optical device, etc. Generally, there is a need for improved hermetic sealing methods to protect thin film devices from environmental damage.

SUMMARY OF CERTAIN INVENTIVE ASPECTS

Certain inventive aspects improve adhesion of frit using a laser to irradiate the frit at the time of hermetic sealing. The irradiation of the laser heats the frit until it has a degree of fluidity. After the frit has been heated the frit is physically pressed, which pressing creates a hermetic seal and thus enhances reliability of an organic light emitting display.

In one aspect an hermetic sealing apparatus comprises a glass mask disposed on an upper surface of a first substrate and a support member disposed on an upper surface of the glass mask. In some embodiments laser irradiation member is positioned on the upper surface of the glass mask. In some embodiments the laser irradiation member is configured to heat the frit. In some embodiments the frit is disposed in a closed curve in a contour region of the lower surface of the first substrate. In some embodiments the laser irradiation member is configured to heat the frit by irradiating the frit along a trace corresponding to the closed curve. In some embodiments a plurality of lower support members are disposed in a contour region of a lower surface of the second substrate, the lower support members configured to support the second substrate. In some embodiments and pressing members are disposed on a lower surface of the lower support members, the pressing members configured to press the frit by applying a pressing force to the lower support member.

In another aspect a method of hermetic sealing comprises providing a glass mask disposed on an upper surface of a first substrate, a support member disposed on an upper surface of the glass mask, positioning a laser irradiation member on the upper surface of the glass mask, heating a frit with the laser irradiation member and pressing the heated frit to seal the first substrate to a second substrate. In some embodiments heating the frit comprises irradiating the frit disposed in a closed curve in a contour region of a lower surface of the first substrate. In some embodiments irradiating the frit comprises moving a laser along a trace corresponding to the closed curve.

BRIEF DESCRIPTION OF THE DRAWINGS

An apparatus according to some of the described embodiments and the illustrated figures can have several aspects, no single one of which necessarily is solely responsible for the desirable attributes of the apparatus. After considering this discussion, and particularly after reading the section entitled "Detailed Description" one will understand how the features of this invention provide advantages that include the ability to make and use the present invention.

FIG. 1B is a schematic cross-sectional view taken along line A-A' of FIG. 1A.

FIG. 2B is a schematic cross-sectional view taken along line B-B' of FIG. 2A.

DETAILED DESCRIPTION OF CERTAIN EMBODIMENTS

Figure 1A:
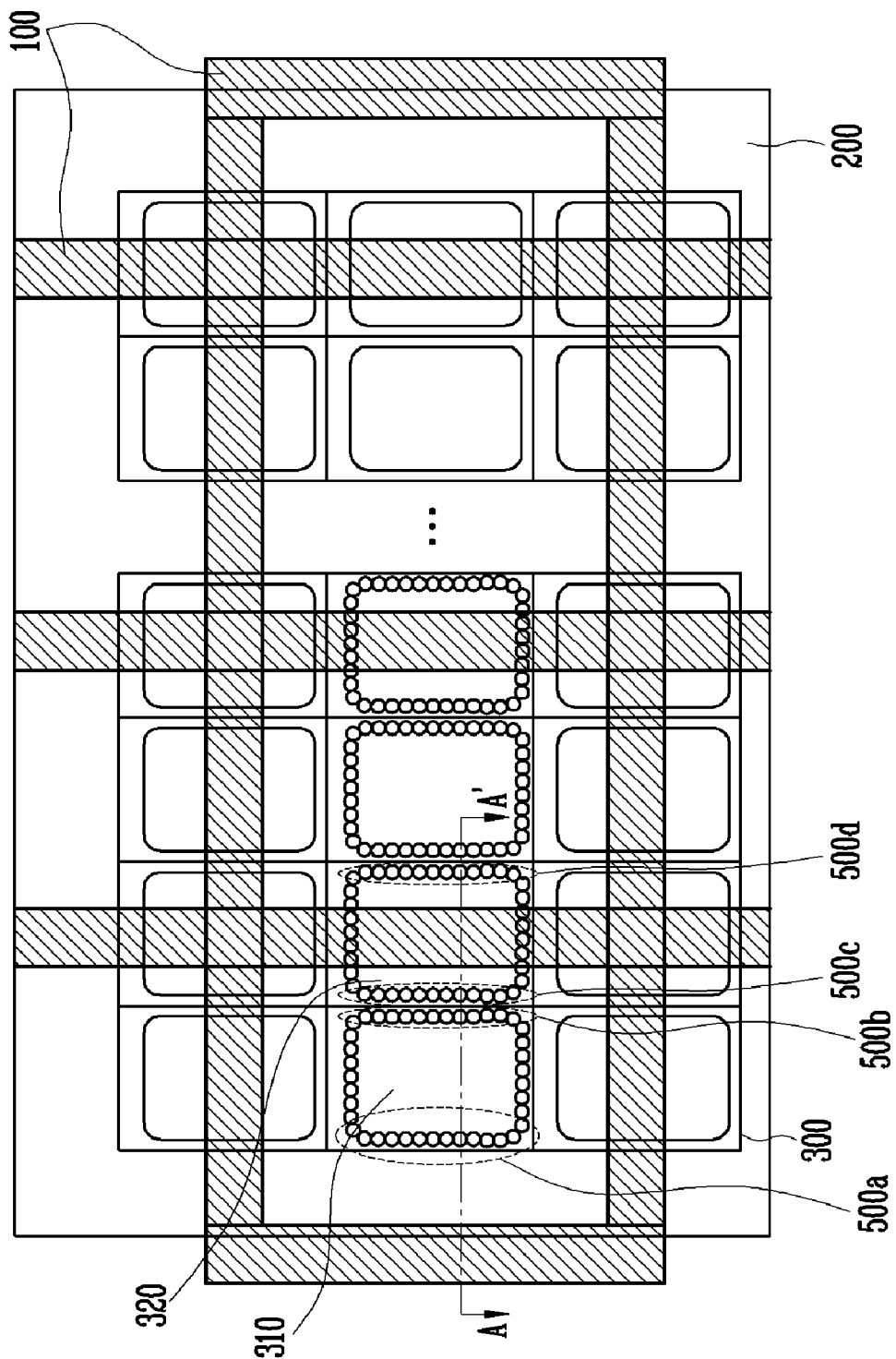
FIG. 1A is a schematic upper surface view of a hermetic sealing apparatus using frit according to one embodiment of the present disclosure.

In the following detailed description, only certain exemplary embodiments have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive. In addition, when an element is referred to as being "on" another element, it can be directly on the element or be indirectly on the element with one or more intervening elements interposed therebetween. Also, when an element is referred to as being "connected to" another element, it can be directly connected to the element or be indirectly connected to the element with one or more intervening elements interposed therebetween. Hereinafter, like reference numerals refer to like elements.

One embodiment of the present disclosure is directed to an organic light emitting display ("OLED"). In some embodiments the OLED is a spontaneously light-emitting device so that it is excellent in view of viewing angle, contrast etc. Generally, the OLED lay does not need a backlight. Thus, the OLED may be designed as both light and thin, with distinct advantages for reduced power consumption.

However, the OLED including electrodes and organic layers provided therein may be easily deteriorated by reacting with oxygen or moisture from environment. Therefore, there is a need to seal the OLED from the environment.

Korean Patent Laid-Open Publication No. 2005-0016578 discloses a method for sealing a first glass and a second glass by heating a frit.

Korean Patent Laid-Open Publication No. 2006-0005369 discloses a hermetic seal used as a barrier against oxygen and water, the size of the hermetic sealing should be minimized not to have a bad influence on the size of an OLED, iii) substances within the organic light emitting display should not be damaged by temperature during the hermetic sealing process, iv) the substances within the organic light emitting display should be contaminated during the hermetic sealing process, and v) an electrical coupler (for example, a thin film chromium) should be entered into the OLED.

Korean Patent Laid-Open Publication No. 2006-0005369 discloses sectional frit heating by laser while attempting to minimize substrate cracking due to heat concentration or a substrate breakdown due to unbalance of coefficient of thermal expansion between materials, by moving laser irradiation members at a constant speed. Publication No. 2006-0005369 adopts a method to apply heat to frit using an irradiating laser to melt the frit. Nevertheless, the temperature drop following heating causes both minute cracks on the frit and peeling.

In general, OLED's that are hermetically sealed often develop minute cracks, which may eventually break the hermetic sealing.

Hereinafter, certain preferable embodiments will be described with reference to the accompanying drawings.

FIG. 1A is a schematic upper surface view of a hermetic sealing apparatus using frit according to one embodiment of the present disclosure. FIG. 1B is a schematic cross-sectional view taken along line A-A' of FIG. 1A.

A support member 100 is disposed on an upper surface of a base substrate 300 and prevents organic light emitting cells from coming up when pressing members 500 apply pressure to a plurality of the organic light emitting cells forming the base substrate 300. The pressing members 500 will be described later.

The support member 100 should sufficiently support the base substrate 300 and should be excellent in view of long time use and corrosion resistance, so that it is exemplarily formed of stainless steel.

A contact member 110 is provided on a lower surface of the support member 100 and directly contacts a glass mask 200. Such a contact member 110 is provided in order to prevent the glass mask 200 from breaking by physical pressure delivered through the support member 100 and exemplarily formed of acrylic or hard rubber having elasticity.

The glass mask 200 is positioned between the base substrate 300 and the support member 100, and a laser irradiation member L passes over the glass mask 200 to irradiate laser thereon. Such a glass mask 200 should be transparent so that laser can be transmitted therethrough and is exemplarily made to be thicker than first substrates 310a and 320a and second substrates 310b and 320b of organic light emitting cells in order to prevent pressure delivered by the support member 100 from being directly delivered to organic light emitting cells 310 and 320.

A plurality of organic light emitting cells are formed on the base substrate 300. During manufacture, the base substrate 300 is cut in a plural number cutting process so that a plurality of organic light emitting cells are manufactured thereon.

The organic light emitting cells includes a light emitting cell formed of an organic light emitting display device, a circuit component for driving the light emitting cell, and a printed circuit board formed with a wiring. In some embodiments the OLED device may include one or more of a hole relevant layer, an emission layer, an electron relevant layer and first and second electrodes. In some embodiments the first and second electrodes are disposed on either side of the hole relevant layer and the electron relevant layer. For convenience only, specific organic light emitting cells 310 and 320 are illustrated in FIG. 1B, but the organic light emitting cells are not limited thereto and one base substrate 300 is configured of a plurality of organic light emitting cells.

As shown in FIG. 1B, the organic light emitting cells 310 and 320 include first substrate 310a and 320a and second substrate 310b and 320b. The organic light emitting cells 310 and 320 include two substrates, which support and receive the light emitting cell, the circuit component for driving the light emitting cell, and the printed circuit board formed of the wiring. All of organic light emitting cells as well as the specific organic light emitting cells 310 and 320 include the first substrate and the second substrate.

For convenience of explanation, among the respective substrates constituting the organic light emitting cells, a substrate contacting the glass mask 200 refers to as a first substrate and a substrate other than the first substrate refers to a second substrate throughout the present specification. The first substrate is identified in the figures with frit, frit identified with the letter "f". The second substrate may be applied with various wirings, inorganic films, etc.

In some embodiments a lower support member is provided on a lower surface of the second substrate to support the adjacent organic light emitting cell and may be formed to simultaneously contact the lower surfaces of two second substrates by being disposed on the border of the organic light emitting cells adjacent to each other.

For convenience of explanation, specific embodiments of lower support members 400a, 400b, and 400c are illustrated in FIG. 1B, however, the lower support member is not limited thereto.

Such lower support member has a predetermined width in order to stably support the organic light emitting cells. Also, the lower support member is exemplarily formed to have a larger width than the distance between frits f of the adjacent organic light emitting cells to prevent the generation of cracks on the second substrate due to the pressure delivered by pressing members to be described later and to uniformly deliver the pressure thereto.

The frit f is used in performing hermetic sealing on the first substrate and the second substrate. The frit f is formed by mixing glass frit powder with binder solution or vehicle. Generally, the hermetic sealing is performed through processes of bonding the two substrates by melting the frit f and then cooling them. The frit f is printed on the lower surface of the first substrate and disposed to form a closed curve on a contour portion of the lower surface of the first substrate.

In some embodiments a laser irradiation member L may be positioned on an upper surface of the glass mask 200. The laser irradiation member may be a short-wavelength laser. In some embodiments the short-wavelength laser is configured with high energy to heat and/or soften the frit f. The frit f is heated or dissolved by laser to bond the first substrate and the second substrate provided in the respective organic light emitting cells. According to the wavelength of the irradiated laser, the frit f is exemplarily formed to include materials to excellently absorb light having such a wavelength.

A guide and/or a driving member (not shown) are provided on the upper of the laser irradiation member L. Accordingly, the laser irradiation member L can move along the trace corresponding to the region where the frit f is printed in the respective organic light emitting cells, and move from one organic light emitting cell to another organic light emitting cell adjacent thereto.

Pressing members are provided on a lower surface of the lower support member. Pressing members may be configured to apply physical pressure to the frit f dissolved by the laser irradiated from the laser irradiation member L.

As shown in FIG. 1B, the pressing members are disposed on the lower surfaces of the lower support members 400a, 400b, and 400c. According to one embodiment, the pressing members are positioned to correspond to a closed curve formed by the frit f provided one organic light emitting cell and formed of a plurality of cylinders 500a, 500b, 500c, and 500d disposed on the lower surfaces of the lower support members. Inside the respective cylinders 500a, 500b, 500c, and 500d, pistons capable of performing an up-and-down motion are provided and can be exemplarily formed of oil pressure cylinders.

For convenience of explanation, specific cylinders 500a, 500b, 500c, and 500d are illustrated in FIG. 1B, however, the pressing members are not limited thereto and all of them are disposed on the positions corresponding to the closed curves formed by the frit f in the respective organic light emitting cells.

A bed member 600 may be further formed on a lower surface of the second substrate. The bed member 600 performs the function to more stably support the base substrate 300 as a whole. The bed member 600 may be exemplarily formed of stainless steel, etc.

Referring to FIG. 1B, operation sequences of a hermetic sealing apparatus using frit according to one embodiment of the present disclosure are described as follows.

In one organic light emitting cell 310 constituting a base substrate 300, a laser irradiation member L is positioned on an upper surface of a region where frit f is positioned to irradiate laser on the frit f.

The irradiated laser is transmitted through a transparent glass mask 200 and a first substrate 310a to arrive at the frit f so that the frit f is heated to be dissolved.

The laser irradiation member L irradiates laser on the whole frit f existing in one organic light emitting cell 310, moving along the trace corresponding to a closed curve formed by the frit f. At this time, the dissolved frit f is applied with physical pressure by pressing members 500a and 500b disposed on the position corresponding to the frit f irradiated by laser.

According to one embodiment, the pressing members are formed of a plurality of cylinders. If the frit f is irradiated by laser to be heated up to 200° C. or more, a piston provided in the inside of the cylinder disposed on the position corresponding thereto rises to apply physical pressure to lower support members 400a and 400b. The physical pressure is applied to a second substrate 310b through the support members 400a and 400b. Through such a series of sequences, the first substrate 310a and the second substrate 310b are strongly bonded to each other by the frit f.

If the hermetic sealing process for one organic light emitting cell 310 is completed, the laser irradiation member L moves to an adjacent organic light emitting cell 320.

The laser irradiation member L moved to an upper surface of the adjacent organic light emitting cell 320 irradiates laser on the whole frit f existing in the adjacent organic light emitting cell 320, moving along the trace corresponding to a closed curve formed by the frit f. At this time, the dissolved frit f is applied with physical pressure by pressing members 500c and 500d disposed on the position corresponding to the frit f irradiated by laser.

As described above, if the frit f is irradiated by laser to be heated up to 200° C. or more, a piston provided in the inside of the cylinder disposed on the position corresponding thereto rises to apply physical pressure to lower support members 400b and 400c. The physical pressure is applied to a second substrate 320b through the support members 400b and 400c. Through such a series of sequences, the first substrate 310a and the second substrate 310b are strongly bonded by the frit f. Through such a series of sequences, the first substrate 320a and the second substrate 320b are strongly bonded to each other by the frit f.

In the process, since the physical pressure is applied from bottom to top by the pressing members, the base substrate 300 may be lifted up. However, since the base substrate 300 is fixed by the support member 100, it is prevented from being lifted up.

The processes are repeated between the adjacent organic light emitting cells in the whole base substrate 300 so that the first substrate and the second substrate existing in the respective organic light emitting cells are bonded to each other.

Figure 2A:
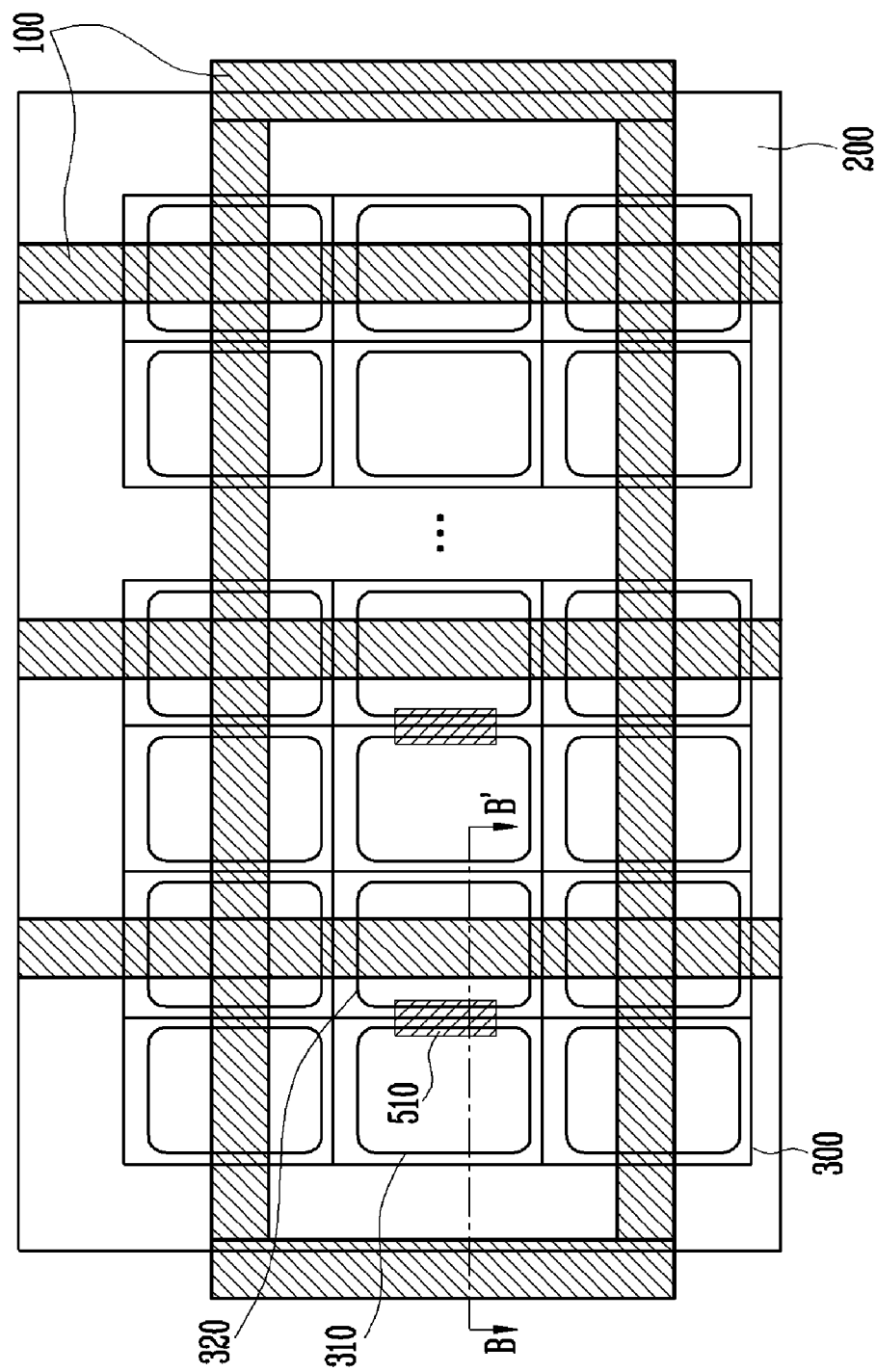
FIG. 2A is a schematic upper surface view of a hermetic sealing apparatus using frit according to another embodiment of the present disclosure.

FIG. 2A is a schematic upper surface view of a hermetic sealing apparatus using frit according to another embodiment of the present disclosure, and FIG. 2B is a schematic cross-sectional view taken along line B-B' of FIG. 2A.

In another embodiment of the present disclosure, most of the constituents are the same as the constituents of the aforementioned embodiment, except pressing members. Hereinafter, the pressing members of another embodiment of the present disclosure will be described.

As shown in FIG. 2B, the pressing member is formed of a roller 510 in another embodiment. The roller 510 is provided on lower surfaces of lower support members 400a, 400b, and 400c, and applies physical pressure to frit f dissolved by laser irradiated from a laser irradiation member L. The width of the roller 510 is formed to be wider than the distance between the adjacent frit f so that the adjacent frit can simultaneously be pressed by the roller 510.

According to another embodiment, the roller 510 presses the dissolved frit f, moving along the trace corresponding to a closed curve formed by the frit f provided in the one organic light emitting cell. Through the process, the first substrates 310a and 320a and the second substrates 310b and 320b are strongly bonded to each other.

For convenience in explanation, a specific roller 510 is illustrated in FIG. 2B, however, other rollers are provided on the boarder of the adjacent organic light emitting cells.

Figure 2C:
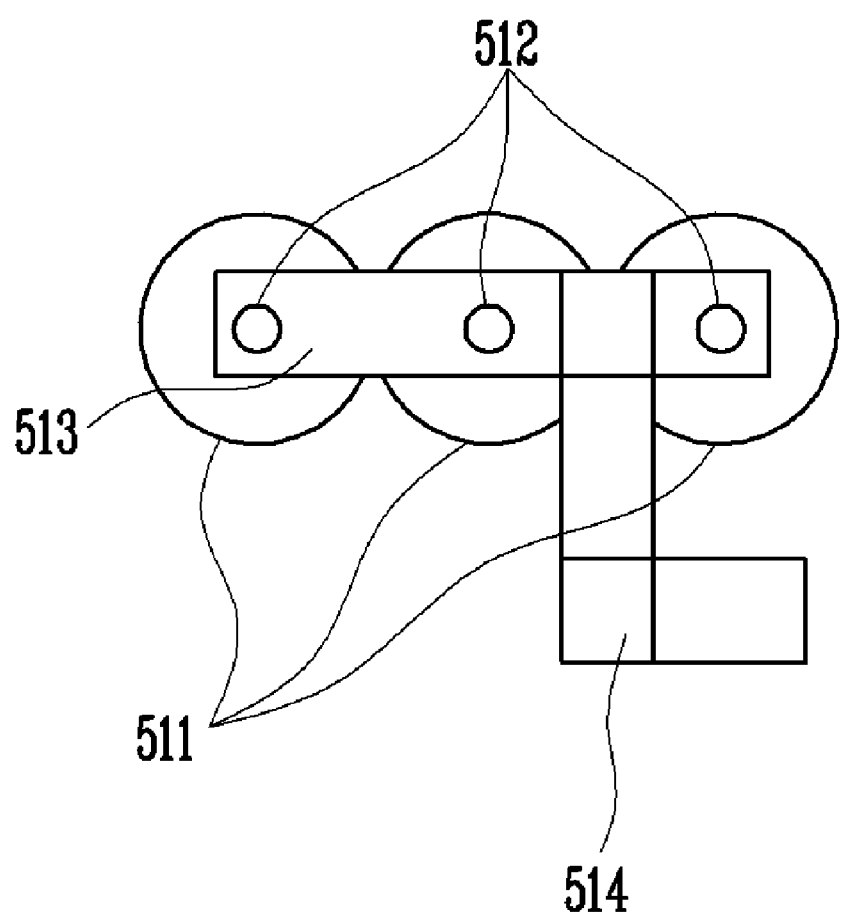
FIG. 2C is a schematic cross-sectional view of a roller according to another embodiment of the present disclosure.

FIG. 2C is a schematic cross-sectional view of a roller according to another embodiment. As shown in FIG. 2C, a roller 510 includes rolls 511, roll shafts 512, a shaft 513, and a guide 514. The rolls 511 contact lower support members 400a, 400b, and 400c and rotate centering on the roll shafts 512. The number of the roll 511 is illustrated as three in FIG. 2C, however, the number of the roll 511 is not limited thereto but the number thereof is properly determined according to circumstances.

These roll shafts 512 are fixed on the shaft 513 and the shaft 513 is coupled to the guide 514. A driving member (not shown) is coupled to a lower of the guide 514 and moves along a closed curved formed by the frit f. As the driving member moves, the roller 510 moves to allow the rolls 511 to press the lower support members 400a, 400b, and 400c. Through the rotation of the rolls 511 the lower support members 400a, 400b, and 400c is delivered with pressure so that first substrates 310a and 320a and the second substrates 310b and 320b are strongly bonded to each other.

Figure 3A:
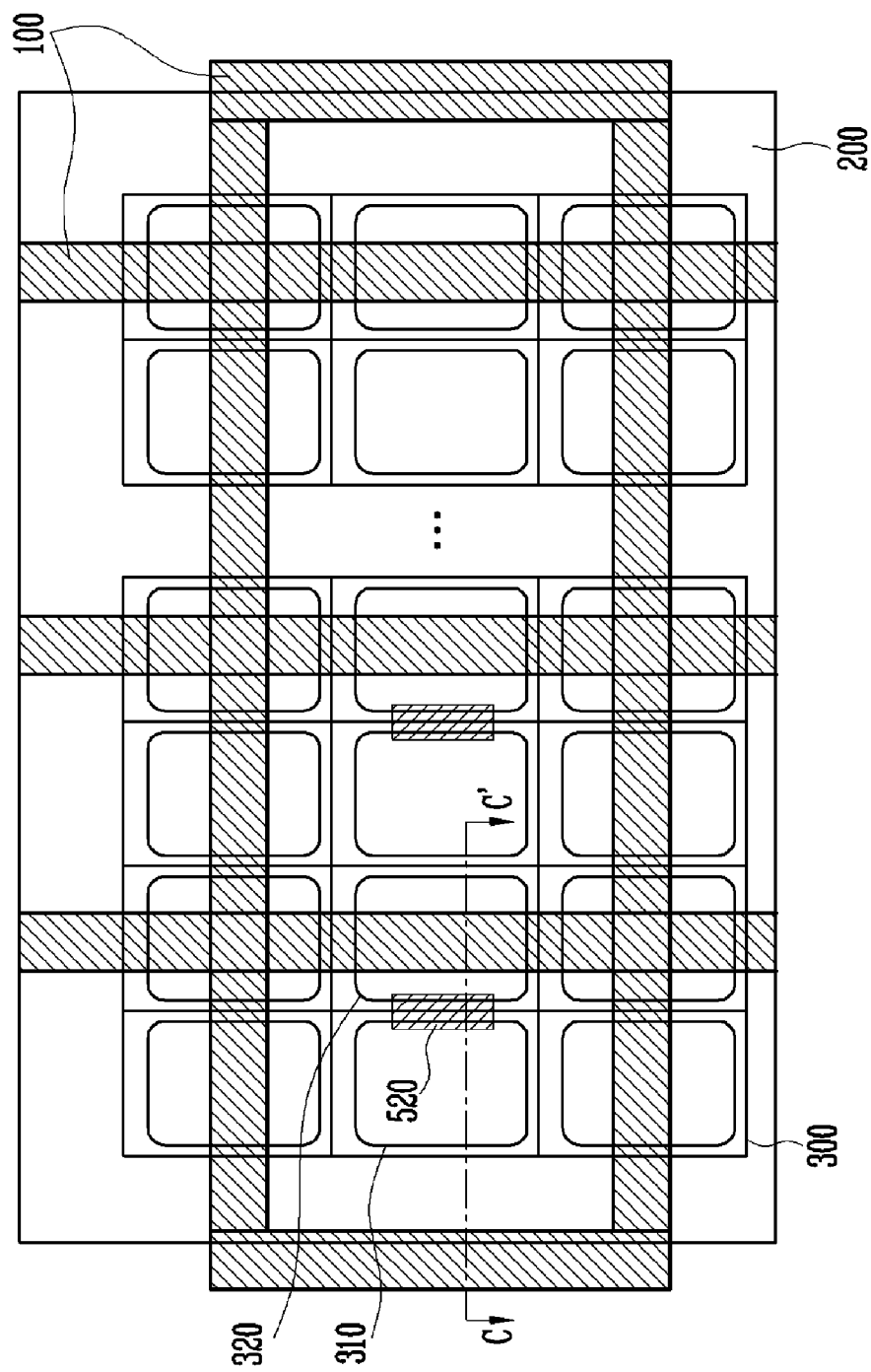
FIG. 3A is a schematic upper surface view of a hermetic sealing apparatus using frit according to another embodiment of the present disclosure.
Figure 3B:
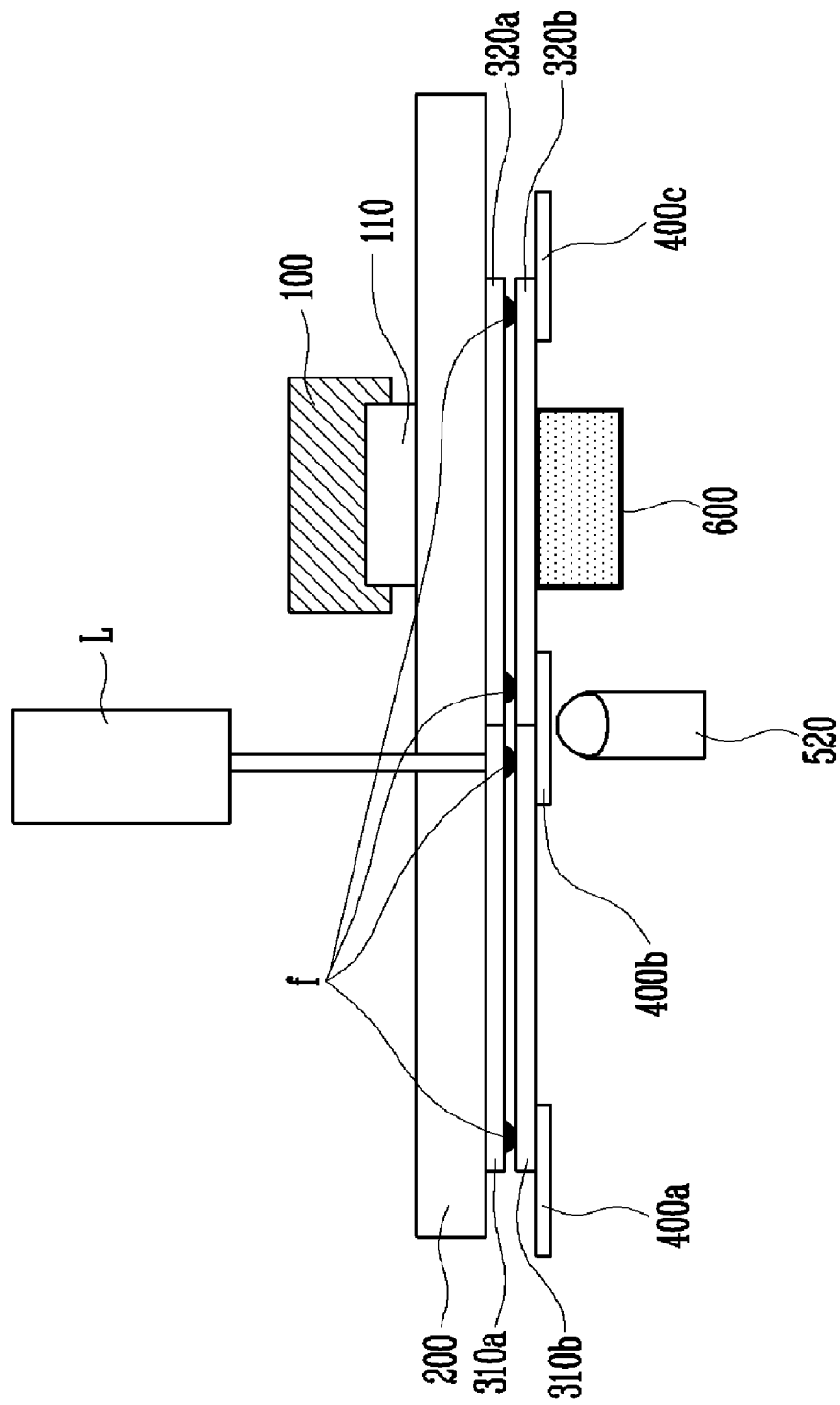
FIG. 3B is a schematic cross-sectional view taken along line C-C' of FIG. 3A.

FIG. 3A is a schematic upper surface view of a hermetic sealing apparatus using frit according to another embodiment of the present disclosure, and FIG. 3B is a schematic cross-sectional view taken along line C-C' of FIG. 3A.

In another embodiment, most of the constituents are the same as the constituents of the aforementioned embodiment of the present disclosure, except pressing members. Hereinafter, the pressing members of another embodiment of the present disclosure will be described.

As shown in FIG. 3B, the pressing member is formed of a moving ball 520 in another embodiment of the present disclosure. The moving ball 520 is provided on lower surface of lower support members 400a, 400b, and 400c and applies physical pressure to the dissolved frit f by laser irradiated from a laser irradiation member L.

According to another embodiment, the moving ball 520 presses the dissolved frit f, moving along the trace corresponding to a closed curve formed by the frit f provided in the one organic light emitting cell. Through the process, the first substrates 310a and 320a and the second substrates 310b and 320b are strongly bonded to each other.

For convenience of explanation, a specific moving ball 520 is illustrated in FIG. 3B, however, other moving balls are provided on the border of the adjacent organic light emitting cells.

Figure 3C:
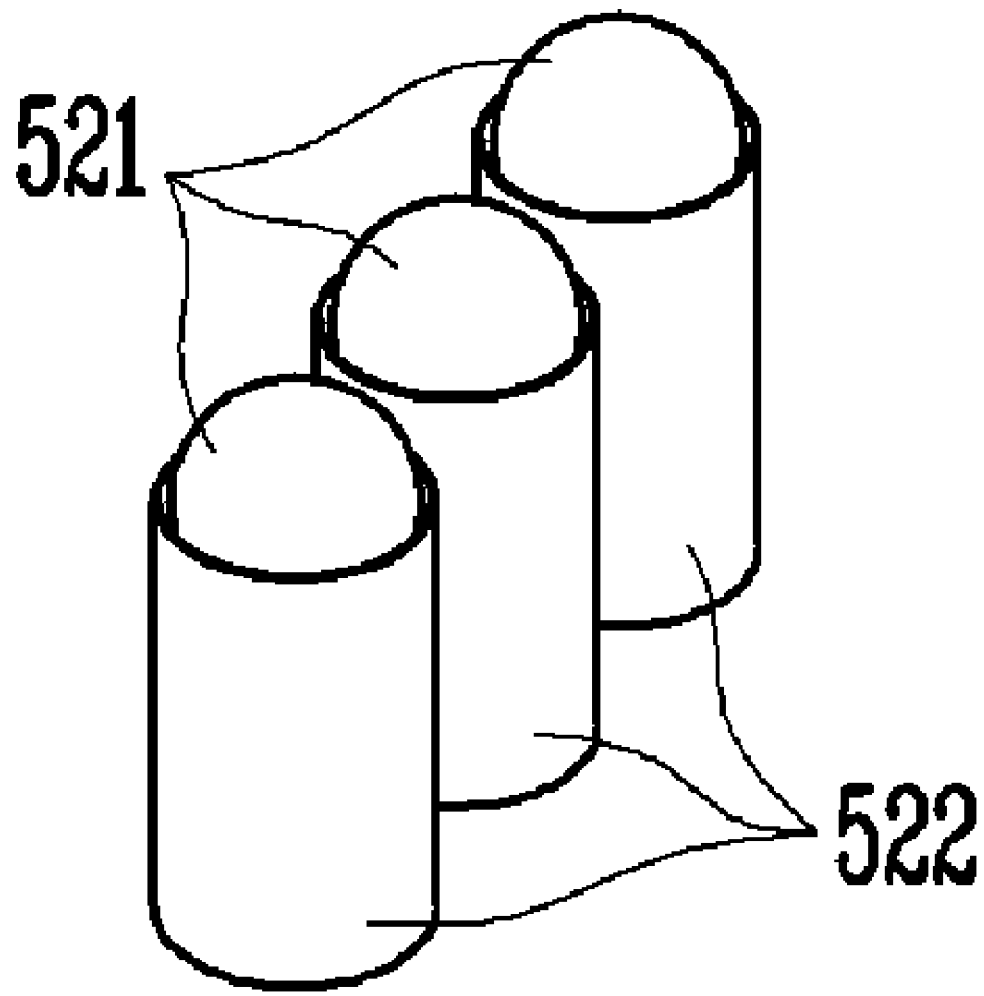
FIG. 3C is a schematic perspective view of a moving ball according to another embodiment of the present disclosure.

FIG. 3C is a schematic perspective view of a moving ball according to another embodiment of the present disclosure. As shown in FIG. 3C, a moving ball 510 is configured of balls 521 and housings 522. The balls 521 contact lower support members 400a, 400b, and 400c and rotate on uppers of the housings 522. The number of the ball 521 is illustrated as three in FIG. 2C, however, the number of the ball 521 is not limited thereto but the number thereof is properly determined according to circumstances.

These balls 521 are fixed on the uppers of the housings 522 and driving members (not shown) are coupled to lowers of the housings 522. The driving members move along a closed curved formed by the frit f. As the driving members move, the moving ball 520 moves to allow the balls 521 to press the lower support members 400a, 400b, and 400c. Through the rotation of the balls 521, the lower support members 400a, 400b, and 400c is delivered with pressure so that first substrates 310a and 320a and the second substrates 310b and 320b are strongly bonded to each other.

As described above, in some embodiments when performing a hermetic sealing using frit, pressure as well as temperature, which is the main factor, can be utilized. Accordingly, some embodiments provide a hermetic sealing apparatus and a method using the same, capable of preventing the generation of cracks and improving reliability of the organic light emitting display by improving adhesion of the frit and reducing size of void in the frit.

While the present disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof. It will be appreciated that no matter how detailed the foregoing appears in the text, the invention can be practiced in additional ways. It should also be noted that the use of particular terminology when describing certain features or aspects of the invention should not be taken to imply that the terminology is being re-defined herein to be restricted to include any specific characteristics of the features or aspects of the invention with which that terminology is associated. Further, numerous applications are possible for devices of the present disclosure. It will be appreciated by those skilled in the art that various modifications and changes may be made without departing from the scope of the invention. As noted above, such modifications and changes are intended to fall within the scope of the invention, as defined by the appended claims.

What is claimed is:

1. A hermetic sealing apparatus, comprising:
   a glass mask disposed on an upper surface of a first substrate;
   a support member disposed on an upper surface of the glass mask;
   a laser irradiation member positioned spaced on the upper surface of the glass mask, the laser irradiation member configured to irradiate and heat a frit, the frit disposed in a closed curve in a contour region of a lower surface of the first substrate and thereby bonding the first substrate to a second substrate;
   a plurality of lower support members disposed in a contour region of a lower surface of the second substrate, wherein the lower support members are configured to support the second substrate; and
   pressing members disposed on a lower surface of the lower support members, the pressing members configured to press the heated frit by applying a pressing force to the lower support member.

2. The hermetic sealing apparatus of claim 1, wherein the pressing members are disposed in the closed curve.

3. The hermetic sealing apparatus of claim 2, wherein the pressing members comprise a plurality of cylinders.

4. The hermetic sealing apparatus of claim 3, wherein the plurality of cylinders comprise pistons contacting the lower support member.

5. The hermetic sealing apparatus of claim 2, wherein the pressing members comprise rollers contacting the lower support members.

6. The hermetic sealing apparatus of claim 2, wherein the pressing members comprise rollers positioned along a trace corresponding to the closed curve shape.

7. The hermetic sealing apparatus of claim 1, wherein the pressing members further comprise balls contacting the lower support members, wherein one or more balls is positioned along the trace corresponding to the closed curve shape.

8. The hermetic sealing apparatus of claim 1 further comprising a contact member provided on a lower surface of the support member.

9. The hermetic sealing apparatus of claim 8, wherein the contact member comprises an elastic material.

10. The hermetic sealing apparatus of claim 1 further comprising a bed member disposed on a lower surface of the second substrate and positioned between the lower support members, the bed member configured to support the second substrate.

11. A hermetic sealing method using frit to bond a first substrate to a second substrate, the method comprising:
    providing a glass mask disposed on an upper surface of the first substrate, a support member disposed on an upper surface of the glass mask;
    providing a plurality of lower support members on a lower surface of the second substrate;
    positioning a laser irradiation member on the upper surface of the glass mask;
    heating a frit with the laser irradiation member; and
    pressing the heated frit to seal the first substrate to the second substrate, wherein pressing the heated frit comprises applying a pressing force to the plurality of lower support members with at least one pressing member.

12. The method of claim 11, wherein heating the frit comprises irradiating the frit disposed in a closed curve in a contour region of a lower surface of the first substrate.

13. The method of claim 12, wherein irradiating the frit comprises moving a laser along a trace corresponding to the closed curve.

14. The method of claim 11, wherein the pressing member comprises balls.

15. The method of claim 11, wherein the pressing member comprises rollers.

16. The method of claim 11, wherein the pressing member comprises pistons.

17. The hermetic sealing apparatus of claim 1, wherein the glass mask comprises a transparent material having a thickness greater than the first and the second substrates.

18. The hermetic sealing apparatus of claim 1, wherein the lower support members comprise a width greater than the distance between adjacent frits.

19. The hermetic sealing apparatus of claim 5, wherein each of the rollers has a width greater than the distance between adjacent frits.

20. The hermetic sealing apparatus of claim 1, wherein the support member comprises a corrosion resistant material.

21. The hermetic sealing apparatus of claim 5, wherein the rollers comprise rolls, roll shafts, a shaft and a guide.

22. The hermetic sealing apparatus of claim 1, wherein the first and the second substrates seal an OLED device formed on one of the substrates.

23. The hermetic sealing apparatus of claim 22, wherein the OLED device comprises a light emitting display device, a circuit component and a printed circuit board.

* * * * *